US010634707B2

(12) United States Patent
Mariethoz et al.

(10) Patent No.: US 10,634,707 B2
(45) Date of Patent: Apr. 28, 2020

(54) METHOD FOR DETERMINING THE POSITION OF A ROTOR OF A POLYPHASE MOTOR

(71) Applicant: MAXON MOTOR AG, Sachseln (CH)

(72) Inventors: Jean-Sebastien Mariethoz, Dietikon (CH); Oliver Schultes, Zürich (CH); Marko Tanaskovic, Zürich (CH); Damian Frick, Zürich (CH)

(73) Assignee: MAXON MOTOR AG, Sachseln (CH)

( * ) Notice: Subject to any disclaimer, the term of this patent is extended or adjusted under 35 U.S.C. 154(b) by 626 days.

(21) Appl. No.: 14/450,426

(22) Filed: Aug. 4, 2014

(65) Prior Publication Data

US 2015/0268283 A1 Sep. 24, 2015

(30) Foreign Application Priority Data

Mar. 24, 2014 (EP) .................................. 14001089

(51) Int. Cl.
| | |
|---|---|
| *G01R 25/00* | (2006.01) |
| *G01D 5/14* | (2006.01) |
| *H02P 6/185* | (2016.01) |
| *H02P 6/18* | (2016.01) |

(52) U.S. Cl.
CPC .............. *G01R 25/00* (2013.01); *G01D 5/14* (2013.01); *H02P 6/183* (2013.01); *H02P 6/185* (2013.01); *H02P 2203/01* (2013.01); *H02P 2203/03* (2013.01)

(58) Field of Classification Search
CPC ...................................................... G01R 25/00
See application file for complete search history.

(56) References Cited

U.S. PATENT DOCUMENTS

| | | | | |
|---|---|---|---|---|
| 5,012,166 A | * | 4/1991 | Ushijima | ........... G11B 19/2009 |
| | | | | 318/400.13 |
| 5,525,886 A | * | 6/1996 | Lyons | ..................... H02P 6/185 |
| | | | | 318/400.13 |
| 7,592,761 B2 | | 9/2009 | MacKay | |
| 9,130,501 B2 | | 9/2015 | Ito et al. | |

(Continued)

FOREIGN PATENT DOCUMENTS

| | | |
|---|---|---|
| CN | 103503303 A | 1/2014 |
| DE | 103 27 599 A1 | 1/2005 |

(Continued)

OTHER PUBLICATIONS

Schwarzkopf, WO/2014/0012637.*

(Continued)

*Primary Examiner* — Stephanie E Bloss
*Assistant Examiner* — Lisa E Peters
(74) *Attorney, Agent, or Firm* — Buchanan Ingersoll & Rooney PC

(57) ABSTRACT

The present disclosure relates to a method for determining the position of a rotor of a polyphase motor, e.g., the rotor angle, particularly at standstill. The method can include: applying voltage to phases of the motor, measuring a current in the phases, and determining the rotor position based on the measured current. According to the present disclosure, determination of the rotor position can be based on current values measured during a period where zero voltage is applied to the respective phases.

21 Claims, 7 Drawing Sheets

(56) References Cited

U.S. PATENT DOCUMENTS

| | | | |
|---|---|---|---|
| 2006/0113948 A1 | 6/2006 | Kaneko et al. | |
| 2007/0080655 A1* | 4/2007 | Tesch | H02P 6/185 318/432 |
| 2008/0258660 A1 | 10/2008 | Lee | |
| 2009/0128074 A1* | 5/2009 | Hu | H02P 6/183 318/400.33 |
| 2010/0181952 A1* | 7/2010 | Cheng | H02P 6/18 318/400.33 |
| 2011/0031909 A1 | 2/2011 | Ohgushi | |
| 2011/0050209 A1* | 3/2011 | Nase | H02P 6/18 324/133 |
| 2011/0248659 A1* | 10/2011 | Balazovic | H02P 6/183 318/400.33 |
| 2011/0298310 A1* | 12/2011 | Ross | H02K 41/06 310/20 |
| 2014/0062353 A1 | 3/2014 | Oyobe et al. | |
| 2014/0084822 A1 | 3/2014 | Ito et al. | |
| 2015/0177297 A1* | 6/2015 | Schwarzkopf | H02P 6/182 702/66 |

FOREIGN PATENT DOCUMENTS

| | | | |
|---|---|---|---|
| EP | 1 662 648 A2 | 5/2006 | |
| EP | 2757683 A1 * | 7/2014 | H02P 21/06 |
| JP | 2011-41343 A | 2/2011 | |
| JP | 2013-172634 A | 9/2013 | |
| WO | WO 2013/001596 A1 | 1/2013 | |

OTHER PUBLICATIONS

Persson, "Innovative Standstill Position Detection Combined with Sensorless Control of Synchronous Motors", 2005Lausanne, EPFL, pp. 1-100.*

Kim, A Novel Method for Initial Rotor Position Estimation for IPM Synchronous Machine Drives, IEEE Transactions on Industry Applications, vol. 40, No. 5, Sep./Oct. 2004, pp. 1369-1378.*

European Search Report dated Sep. 17, 2014, by the European Patent Office for Application No. 14001089.3.

M. Schrodl et al., "New Rotor Position Detector for Permanent Magnet Synchronous Machines Using the "Inform"-Mehtod", ETEP, vol. 1, No. 1, Feb. 1, 2007, pp. 47-53, XP-002729234.

Blaschke et al., "Sensorless Direct Field Orientation at Zero Flux Frequency", Industry Applications Conference, 1996. Thirty-First IAS Annual Meeting, IAS '96., Conference Record of the 1996 IEEE, (Oct. 1996), vol. 1, pp. 189-196.

Corley et al., "Rotor Position and Velocity Estimation for a Salient-Pole Permanent Magnet Synchronous Machine at Standstill and High Speeds", IEEE Transactions on Industry Applications, (Jul./Aug. 1998), vol. 34, No. 4, pp. 784-789.

Holtz, "Acquisition of Position Error and Magnet Polarity for Sensorless Control of PM Synchronous Machines", IEEE Transactions on Industry Applications, (Jul./Aug. 1998), vol. 44, No. 4, pp. 1172-1180.

Mariéthoz et al., "Multisampled Model Predictive Control of Inverter Systems: a Solution to Obtain High Dynamic Performance and Low Distortion", Energy Conversion Congress and Exposition (ECCE), 2012 IEEE, (Sep. 15-20, 2012), Raleigh, NC, USA, pp. 1692-1697.

Schroedl, "Sensorless Control of AC Machines at Low Speed and Standstill Based on the "INFORM" Method", Industry Applications Conference, 1996. Thirty-First IAS Annual Meeting, IAS '96., Conference Record of the 1996 IEEE, (Oct. 6-10, 1996), vol. 1, pp. 270-277.

Schroedl et al., "Sensorless Control of Reluctance Machines at Arbitrary Operating Conditions Including Standstill", IEEE Transactions on Power Electronics, (Mar. 1994), vol. 9, No. 2, pp. 225-231.

Shinnaka, "A New Speed-Varying Ellipse Voltage Injection Method for Sensorless Drive of Permanent-Magnet Synchronous Motors with Pole Saliency-New PLL Method Using High-Frequency Current Component Multiplied Signal", IEEE Transactions on Industry Applications, (May/Jun. 2008), vol. 44, No. 3, pp. 777-788.

Chinese Office Action ("Notice on the First Office Action") dated Apr. 27, 2017, by the State Intellectual Property Office of the People's Republic of China in corresponding Chinese Patent Application No. 201510131558.8 and English translation of the Office Action (13 pages).

Japanese Office Action dated Jan. 8, 2019, by the Japanese Patent and Trademark Office in corresponding Japanese Patent Application No. 2015-059762, with English translation. (7 pages).

Office Action (Notification of Reasons for Refusal) dated Oct. 8, 2019, by the Japanese Patent Office in corresponding Japanese Patent Application No. 2015-059762, and an English Translation of the Office Action. (6 pages).

* cited by examiner standard fixed frequency fixed phase PWM scheme

Conventional PWM, SVM or SVPWM

PWM scheme at standstill and very low speed | mid- and high-speed range

Variable phase/frequency PWM

Sampling with conventional PWM, SVM or SVPWM

Sampling with variable phase/frequency PWM (a) equivalent applied rotating voltage pattern (b) resulting currents (b) equivalent applied rotating voltage pattern (b) resulting currents (a) phase diagram of first model harmonic (b) phase diagram of second model harmonic

METHOD FOR DETERMINING THE POSITION OF A ROTOR OF A POLYPHASE MOTOR

The present invention relates to a method for determining the position of a rotor of a polyphase motor, i.e. the rotor angle, particularly at standstill. The method comprising the following steps:
applying voltage to phases of the motor,
measuring a current in the phases, and
determining the rotor position based on the measured current.

Methods of the aforementioned type are well known from the prior art.

1 Introduction

Field oriented control is probably the most effective control technique for obtaining high dynamic performance AC electric drives. Using advanced control techniques with field oriented control allows to achieve a performance close to the machine theoretical limitations. In that case, the performance is mainly limited by the accuracy of the flux orientation estimate. In synchronous drives, the flux position is directly linked to the rotor mechanical position and a position encoder is often used for determining the flux orientation. Encoders are generally one of the weakest components of drive systems and their impact on the system reliability and cost is often substantial. Encoder-less control is therefore an area of intensive research in the scientific community. Encoder-less control is hereinafter referred to as sensor-less control. In sensor-less control, the rotor flux orientation, magnitude and angular velocity are estimated using a model of the drive system and available measurements. The measurements available are most often the inverter DC voltage and the phase currents. Knowing the applied voltage pulse pattern allows to approximate the applied stator voltages. Sensorless control is sometimes based on additional measurements such as the stator neutral point voltage. The main effects that are used to estimate the flux orientation are
the back-EMF (electromagnetic flux), which is the voltage induced by the flux angular velocity,
the reluctance anisotropy that arises from geometric and magnetic anisotropies.

Back-EMF based techniques require a minimum flux velocity to operate. The two reasons are the magnitude of back-EMF, which varies linearly with the speed and thus vanishes at standstill and the inverter distortion that becomes dominant and is difficult to filter at very low speeds, thus preventing its effect to be separated easily from the back-EMF effect. Anisotropies can be exploited at standstill and very low speed provided there is sufficient excitation of the associated modes and the inverter distortion is sufficiently small or well compensated. A voltage generally needs to be applied to the drive, possibly superimposed to the torque producing voltage to obtain this excitation. The inverter distortion is still the main bottleneck of sensorless control schemes.

2 Review of Existing Approaches Known from Prior Art

2.1 Basic Principles of Techniques Based on High-frequency Signal Injection

A careful analysis of the state-of-the-art reveals that the sensorless control techniques based on high-frequency signal injection are directly or indirectly based on the variation of reluctance (or equivalently the inductance tensor or matrix) as a function of the position, which is reflected by the following model in stator coordinates $$\underbrace{L^s(\theta_r)\frac{di_s^s}{dt}}_{\substack{\text{position}\\\text{information meas.}\\\text{at output}\\\text{standstill}}} + J\omega_r\psi_r + J\omega_r\frac{dL^s(\theta_r)}{d\theta_r}i_s^s + \underbrace{R_s i_s^s}_{\substack{\text{generally}\\\text{neglected}\\\text{term}}} = \underbrace{u_s^s}_{\substack{\text{input}\\\text{exc.}}} \quad (1)$$

For simplicity, this model is based on the assumption that the stator current does not affect the saturation level of the machine. From this simple model, we can see that only the inductance dependence on the rotor position can be used at standstill. Since the inductance is a factor of the current derivative, we can moreover deduce that a sufficient excitation is required at standstill such that the derivative of the current allows obtaining a good estimate of the rotor position. These simple observations situate the framework within which all techniques are based. The impact of the stator resistance is generally neglected.

2.2 Review of Techniques Based on High-frequency Signal Injection

2.2.1 INFORM approach

Sensorless control of AC machines based on high-frequency signal injection can be traced back to the work by Schroedl et al, who introduced the so-called Indirect Flux detection by Online Reactance Measurement (INFORM) method. The method was initially proposed for reluctant motors [2] but it generally applies to all AC machines featuring sufficient reluctance variation (as a function of the rotor or flux position). The method applies several test voltage vectors and measures the current derivatives caused by each of these voltage vectors to measure the stator complex inductance. The rotor position is deduced from the measured inductance.

Analysing the approach in more detail, it starts by obtaining each current derivative by measuring two successive samples during the application of the same vector, which requires the application of a pulse longer than the AD sampling period $$\frac{di_s^x}{dt} \approx \Delta i_k^x = \frac{i_s^x(t_{k+1}) - i_s^x(t_k)}{t_{k+1} - t_k} \quad (2)$$

with $$x \in \{\alpha, \beta\}$$

The approach assumes that the inductance tensor is diagonal and that the inductance does not vary in the rotating reference frame. Under these assumptions, all inductances vary as a sinus of twice the rotor angle in the stator reference frame, which allows one to write $$-(\bar{L}_s + \Delta L_s\cos 2\theta_r)\frac{di_s^\alpha}{dt} - \Delta L_s\sin 2\theta_r\frac{di_s^\beta}{dt} + u_s^\alpha - R_s i_s^\alpha + \omega_r\psi_s\sin\theta_r = 0 \quad (3a)$$

$$-(\bar{L}_s - \Delta L_s\cos 2\theta_r)\frac{di_{s\beta}}{dt} + \Delta L_s\sin 2\theta_r\frac{di_{s\alpha}}{dt} + u_{s\beta} - R_s i_{s\beta} + \omega_r\psi_s\cos\theta_r = 0 \quad (3b)$$

These equations reveal the coupling between the α and β axis current derivatives caused by the inductance anisotropy. In [2], Schroedl observes that the anisotropy causes a misalignment of the current vector with respect to the voltage vector at standstill and that the deviation between the voltage and the current vector that follows can be exploited to deduce the rotor position if a suitable test sequence is constructed. The issue is that the speed and machine parameters need to be known to extract position information directly from these equations from the application of a single voltage vector, which would make the estimation particularly sensitive. In order to mitigate this issue, he proposes to apply several distinct voltage vectors and the above equations are subtracted one from each other assuming the position and velocity did not change during the measurement, which allows eliminating the dependence on the parameters obtaining a set of equations indexed by k $$\Delta u_k^\alpha - \Delta L_S(\Delta i_k^{2\alpha} \cos 2\theta_r + \Delta i_k^{2\beta} \sin 2\theta_r) = 0 \quad (4a)$$

$$\Delta u_k^\beta - \Delta L_S(-\Delta i_k^{2\beta} \cos 2\theta_r + \Delta i_k^{2\alpha} \sin 2\theta_r) = 0 \quad (4b)$$

defining $\Delta u_k^x = u_{k+1}^x - u_k^x \Delta i_k^{2x} = \Delta i_{k+1}^x - \Delta i_k^x$ One can readily solve these equations to obtain the magnitude of the anisotropy $\Delta L_S$ and twice the angular position $2\theta_r$ as a function of the measurements and applied voltage vectors.

The approach is quite sensitive to noise as it directly inverts the model. It is, however, not very sensitive to inverter distortion as it indirectly measures the current derivatives during the application of a single voltage vector. It requires fast current sampling and its maximum accuracy is linked to the stability of the DC voltage and accuracy of its measurements during the measurement cycle.

The current control is interrupted during the application of the test voltage vectors, which causes a large distortion of the stator currents and associated torque ripple and distortion. Moreover, depending on the test sequence, the rotor might move in the wrong direction. These are the main drawbacks of the approach, which could in principle be extended to maintain current control during the measurements and apply a pattern that does not cause any DC torque at the cost of a higher complexity.

2.2.2 Modulation/Demodulation Approaches

In [3] Corley and Lorenz propose an approach based on the same anisotropy principle but where the injected high-frequency voltage is superimposed to the reference voltage given by the current controller to the PWM module.

Many sensorless control schemes were based on the scheme by Corley and Lorenz. The general principle is represented in FIG. 2. The high-frequency reference is superimposed to the stator voltage computed by the control scheme. The high- and low-frequency currents need to be separated such that the high frequency components of the injection do not perturb the control and such that the low frequency (often called fundamental frequency despite the fact that it may not be a steady state waveform) does not affect the estimation scheme. For this low- and high-pass filters are employed. The high frequency signal is demodulated, that is multiplied with the carrier frequency waveform to obtain a DC signal that measures the position error. The error signal is integrated to update the reference frame position. This type of schemes is quite sensitive to the inverter distortion. It is also sensitive to model and parameter mismatch.

Many research works studied how to mitigate this sensitivity. In [3] the approach is modified to correct the phase shift induced by the resistor on the demodulated current. The high-frequency signal is generally demodulated using the injected voltage. In [4] the injected current is used instead of the voltage as demodulating signal.

2.2.3 Voltage Pulse Injection Method

In [5] a voltage pulse injection method very similar to the INFORM approach is outlined. The voltage pulses are injected in each motor phase one after the other and the magnitude of the current pulses that follow are measured and compared to deduce the 60° sector in which the magnet is situated. The technique is very simple but also very sensitive to inverter distortion and the sampling instant. The document also describes a back-EMF based approach used during motion as it is not clear if the described approach can work during motion.

2.3 Review of Flux Polarity Detection Methods

The polarity of the flux is not detected by the procedures above due to an ambiguity of $\pi$ over the detected angle.

[6] injects a positive and a negative current parallel to the detected flux direction and uses the difference of inductance caused by the saturation to detect the polarity.

A technique based on the same principle is reported in [4]. A high magnitude pulse is injected. The technique is sensitive to the distortion on the applied pulse and to the instant at which the current is sampled.

2.4 Analysis of the Sensorless Control Limitations

Directly or indirectly, all methods inject some excitation and measure the impact of this input on the measured output using relation (1). There are three major bottlenecks that limit the accuracy of the estimated position. The problems described below are critical for all sensorless control schemes proposed so far and they are solved by our approach.

2.4.1 Inverter distortion

The first problem arises from the impact of the inverter distortion on the current waveforms at standstill and at very low speed. The duty cycle is very small at standstill and low-speed such that it is comparable to the interlock time. As a consequence, the rising and falling times of the switch voltage and currents are no longer negligible. For this reason, it is difficult to precisely determine the voltage applied to the system. The interlock time is usually relatively well known but the current cannot be measured precisely enough to determine the applied waveforms in all situations. Moreover the rise and fall times depend on the switch characteristics and operating point and the voltage waveform during switching depends on the circuit parasitic capacitance and inductance. These phenomena cause a voltage contribution that can be approximated by dividing the interlock time by the switching period and multiplying this quantity with the DC voltage. The value is typically comparable to the applied voltage at low speed, which means the error is comparable to the applied magnitude and it is not possible to reliably use this information. The first problem is typically critical because most sensorless control techniques deduce the position from the relation between the system input and its output. The position information is deduced from the deviation between the estimated output and the actual output or directly from the response of the output to a given input excitation. Since the input is badly known, this information is superimposed with the error coming from this uncertainty. The position is impossible to estimate at speeds where the uncertainty becomes bigger than the sought deviation signal.

2.4.2 Inverter and measurement delays

The second problem is the delay between the applied control signals and the measurement of the current samples. Conventional schemes are sensitive to delay because they use the injected signal to demodulate the signal that carries the position information.

2.4.3 DC voltage ripple

The third problem is the DC-voltage ripple. For estimating position on motors with very small anisotropies, even small ripple from the supply can cause a bias. The ripple may moreover be correlated with the excitation, which may increase the bias.

3. Invention
3.1 Summary of the invention and preferred embodiments

The object of the present invention is to present a method of the generic kind that allows a precise determination of the rotor position at standstill and/or very low speeds.

The object is solved by the features of independent claim 1. According to the invention, determination of the rotor position is based on current values measured during a period where zero voltage is applied to the respective phases. The invention has the advantage that a mathematical model of the motor is simplified because terms comprising the voltage can be neglected. Furthermore, the invention allows that determination of the rotor position be based on the identification of the matrix of system time constants. The invention presents a solution to eliminate nearly totally the impact of the inverter distortion and thus to obtain very accurate estimate of the position.

Within the meaning of the present invention, the term "applying voltage to phases of the motor" also applies if a voltage is actually applied to only one of the phases. Depending on the excitation angle, the voltage tensor applied to the phases is composed of the voltages applied to each single phase, where some components may also be zero.

Preferably, the mathematical model used for determining the rotor position does not consider voltage. At high rotational velocities, the voltage induced by the rotor flux angular velocity can not be neglected. In that case, a different method for determining the rotor position may be used.

Advantageous embodiments of the present invention are subject of the dependent claims.

In a particularly preferred embodiment of the present invention, determination of the rotor position is based solely on current values measured during a period where zero voltage is applied to the respective phases.

In another preferred embodiment of the present invention, determination of the rotor position is based on the identification of time constants. This allows a very simple yet precise determination of the rotor position. Preferably, the determination is based on the identification of the matrix of time constants, i.e. the time constant tensor.

In another preferred embodiment of the present invention, the method comprises the following steps:
  applying a first voltage pulse to the phases of the motor, wherein the voltage pulse is followed by a first zero-voltage period where zero voltage is applied,
  measuring a first current value from the phases at a first time instant within the first zero-voltage period, and
  measuring a second current value from the phases within the first zero-voltage period at a second time instant following the first time instant,
  applying a second voltage pulse to the phases of the motor, wherein the voltage pulse is followed by a second zero-voltage period where zero voltage is applied,
  measuring a first current value from the phases at a first time instant within the second zero-voltage period, and
  measuring a second current value from the phases within the second zero-voltage period at a second time instant following the first time instant.

A resulting current vector is composed of the current values in each of the considered motor phases. Preferably, the zero-voltage period is considerably longer than the voltage pulse. In a particularly preferred embodiment, the zero-voltage period is at least twice as long as the voltage pulse, and further preferred at least five times as long as the voltage pulse. This allows that the current in the zero-voltage period can easily and precisely be measured.

Measuring a first current value and a second current value within the same zero-voltage period is the minimal requirement for calculating the rotor angle. However, for a better estimation, preferably a first set of current values is measured from the phases at a plurality of time instants within the first zero-voltage period, and a second set of current values is measured from the phases within the first zero-voltage period at a plurality of time instants shifted by a constant time shift. For example, if the time instants are 1, 2, 3, 4, 5, 6, then the first set of current values may be taken at time instants 1, 2, 3, 4, 5, and the second set of current values at time instants 2, 3, 4, 5, 6. Alternatively, if the first set of current values is taken at time instants 1, 2, 3, 4, the second set of current values may be taken at time instants 3, 4, 5, 6. Therefore, the current values in the two sets can overlap. The more first and second current values can be compared, the more precise the determination of the rotor position is.

In another preferred embodiment of the present invention, a plurality of voltage pulses is applied to the phases of the motor, each voltage pulse being followed by a zero-voltage period where zero voltage is applied, and wherein a first and second set of current values is measured within each of the zero-voltage periods at a first time instant and a second time instant respectively. Preferably, a plurality of sets of current values is measured at a plurality of time instants within each of the zero-voltage periods, in order to allow a precise determination of the time constants.

In order to determine the rotor position very precisely, it is advantageous to measure a large number of current values after a large number of voltage pulses respectively. The higher the number of voltage pulses, the better. Therefore, in another preferred embodiment of the present invention, at least 6, preferably at least 12, and further preferably at least 24 voltage pulses are applied. Preferably, a resulting excitation angle of a voltage pulse differs from a resulting excitation angle of a preceding voltage pulse. The excitation angle is described in the α/β stator coordinate system.

To allow a precise determination of the rotor position at standstill, the resulting excitation angles of the voltage pulses are chosen such that an overall torque applied to the rotor by the plurality of voltage pulses is zero. Due to the system inertia, each pulse may cause torque on the rotor, as long as the resulting torque of a short time interval is zero. In order to achieve zero torque, it is advantageous if a first pulse is followed by a second pulse having an excitation angle of 180 degrees plus the excitation of the first pulse. In addition, it is advantageous if the excitation angle increment between a pulse and the next but one pulse is 360 degrees divided by the number of voltage pulses.

In another preferred embodiment of the present invention, determination of the rotor position is based on a model of the stator current dynamics expressed by the following equation in stator coordinates (α, β):

$$\frac{d\vec{i}^s}{dt} = -R^s(L^s)^{-1}\vec{i}^s$$

with $i^S$: stator current,
$R^S$: stator resistance,
$L^S$: stator inductance.

In another preferred embodiment of the present invention, for each zero-voltage period, a first resulting current vector is determined from the first set of current values and a second resulting current vector is determined from the second set of current values, wherein the variation between the first and second resulting current vectors is expressed as a variation vector, depending on the rotor position and the excitation angle, times the amount of the first resulting current vector, wherein the variation vector is characterized as a function of the excitation angle by a reduced number of harmonic functions, and wherein the rotor angle is estimated by determining coefficient vectors of the reduced number of harmonic functions. According to this method, a system of equations with a plurality of equations is found that can easily be solved. Preferably, the variation between the first and second resulting current vectors is projected in the stator current axis. This means, one axis of the used coordinate system is orientated in direction of the first resulting current vector, the other axis is orientated orthogonal.

Preferably, the variation between the first and second resulting current vectors is modelled by the following function:

$$\Delta i_{k+1}^i = \Delta a^i(\theta_r, \theta_i) \cdot i_k^i \text{ with}$$

$\Delta i_{k+1}^i$: variation between first and second resulting current vectors projected in the stator current axis,
$\Delta a^i(\theta_r, \theta_i)$: variation vector,
$\theta_r$: rotor angle, i.e. rotor position in stator coordinates $(\alpha, \beta)$,
$\theta_i$: excitation angle in stator coordinates $(\alpha, \beta)$,
$i_k^i$: amount of the first resulting current vector at time instant k The system of equations can easily be solved if the variation vector is characterized by a reduced number of harmonic functions as follows:

$$\Delta a^i(\theta_r, \theta_i) = \sum_v [a_v^i(\theta_r)\cos(v\theta_i) + b_v^i(\theta_r)\sin(v\theta_i)]$$

with
$a_v^i(\theta_r), b_v^i(\theta_r)$: coefficient vectors.

Preferably, v=1, 2, 3.

It should be noted that $\theta_r$ can not be deduced from $a_0^i$ and $b_0^i$, as they are constant.

The terms that depend on $\theta_r$ are $a_{1,2}^i$ and $b_{1,2}^i$.

In another preferred embodiment of the present invention, the voltage is applied to the phases of the motor by a pulse width modulation inverter, wherein the pulse width modulation frequency at standstill of the motor is reduced compared to the frequency at high rotating speeds. Preferably, the frequency is also reduced at low rotating speeds of the rotor such that the method according to the invention can also be applied at low rotating speeds.

Preferably, the pulse width modulation frequency is reduced by at least 50%, preferably by at least 65%, and further preferably by at least 80%. The ratio of the pulse width modulation and the sampling frequency used for measuring the current in the motor phases has to be such that at least two current values can be taken during a zero-voltage phase. The more current values can be taken within a zero-voltage phase, the better estimation quality will be obtained regarding the rotor position. It is particularly advantageous if the pulse width modulation frequency is reduced such that a sampling frequency used for measuring the current in the motor phases is at least 10 times higher, preferably at least 20 times higher than the pulse width modulation frequency.

BRIEF DESCRIPTION OF THE DRAWINGS

Other features and advantages will become apparent from the following description of exemplary embodiments when read in conjunction with the accompanying drawings, wherein.

3.2 Detailed Description of the Invention

Existing high frequency signal injection approaches are based on estimating the position by directly inverting the model of the machine based on measurements taken at one or two time instants, which makes them sensitive to noise. They are moreover based on using the relation between the system input, i.e. the applied voltage and the system output, the measured currents, which make them sensitive to inverter distortion at standstill and very low speed.

In contrast, the approach according to the present invention is based on the identification of the discrete-time system dynamics. It means it uses a large number of measurements to identify the discrete-time system dynamics and get the position from the identified parameters, which makes it robust to noise. It is moreover based on the relation between the past output of the system and the current output of the system, with no dependence on the system input, which makes it robust to inverter distortion. It is based on the identification of the matrix of system time constants to estimate the position. This new approach allows to get rid of the key bottleneck of all state-of-the-art approaches, the inverter distortion. This result could not be achieved by former approaches that are directly or indirectly based on the variation of inductance and are neglecting stator resistance. The accuracy obtained with the approach according to the present invention is increased by several orders of magnitudes compared to state-of-the-art approaches. The scheme can work using current sensors such as shunt placed in series with the bottom switches. This was not possible with former approaches. This is a key point of the inventive concepts and of the developed technology. An injection based scheme that would use shunt resistors would either be based on an average measurement of the current (and thus be fairly inaccurate) or be based on the technology presented in the present application.

Figure 1A:
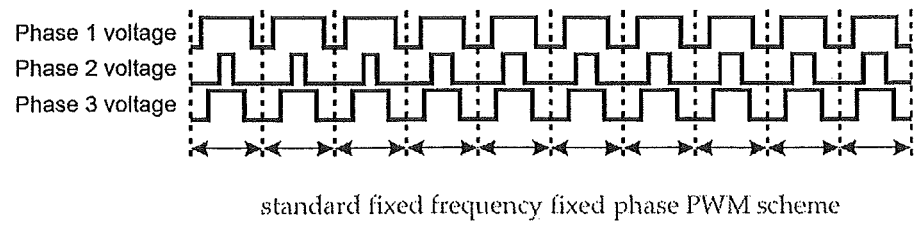
FIG. 1(a) shows a known drive which uses a fixed frequency fixed modulation technique.
Figure 1B:
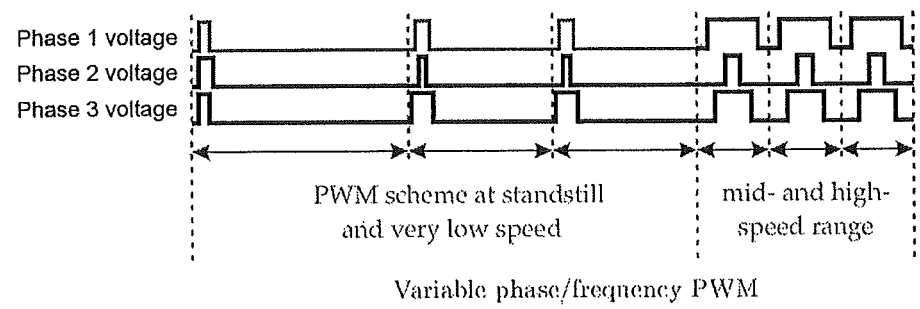
FIG. 1(b) shows a variable switching frequency and phase PWM scheme used according to an exemplary embodiments disclosed herein.
Figure 2:
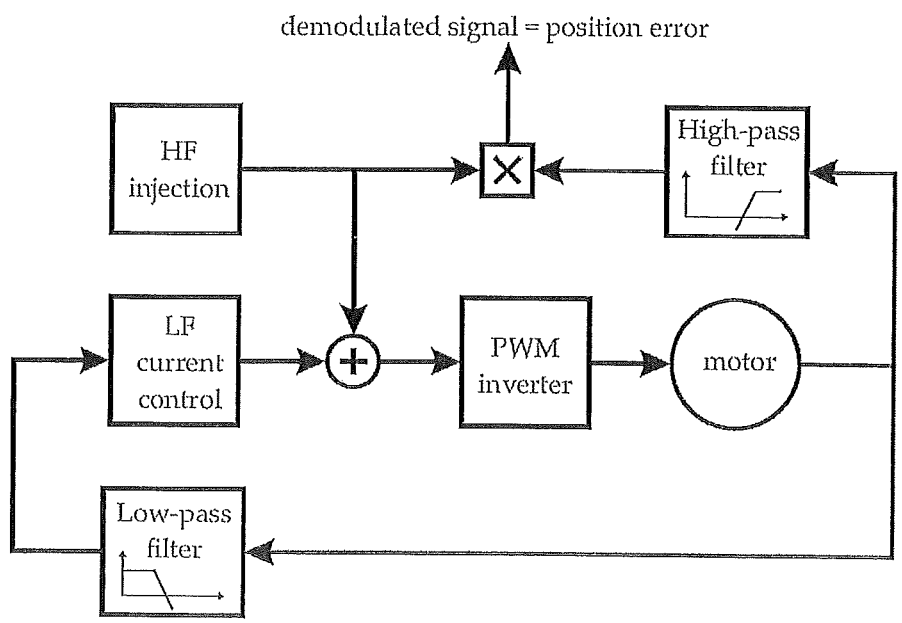
FIG. 2 shows a known sensorless control scheme.

Conventional drives use either a fixed frequency fixed modulation technique as illustrated in FIG. 1(a) (for a three phase motor) or sliding mode control (e.g. DTC). The different PWM (pulse width modulation) based techniques of existing sensorless control methods vary only little. They vary only in the way they calculate the pattern and in the applied common mode voltage. As a consequence, all those schemes generate very similar patterns, which are generally centred pulse with fixed switching period. In fact, the inverter distortion increases with the switching frequency. The switching frequency cannot however be reduced to operate the drive efficiently over the whole speed range. In contrast with existing schemes that use fixed frequency fixed modulation scheme, a variable switching frequency and phase PWM scheme as illustrated in FIG. 1(b) is preferably used according to the present invention. This increases the accuracy and estimated position bandwidth. It is difficult to identify the matrix of time constants without adjusting the switching frequency and the PWM as it would require AD (analog to digital conversion) with much higher accuracy and sampling rate. This point is therefore one of the key distinctive features that identifies the developed technology. It is easy to verify if a drive uses a variable switching frequency or not. By using multisampling (taking more than one or two samples in the switching period), the accuracy can be increased.

The matrix of time constants varies with the rotor position and applied stator currents. An harmonic model of the time constant matrix allows to represent the dynamics in a compact way. The position including the polarity of the rotor is deduced from the coefficients of this model. The scheme is the first scheme capable of detecting the polarity without injecting a pulse in parallel with the magnet.

Figure 8:
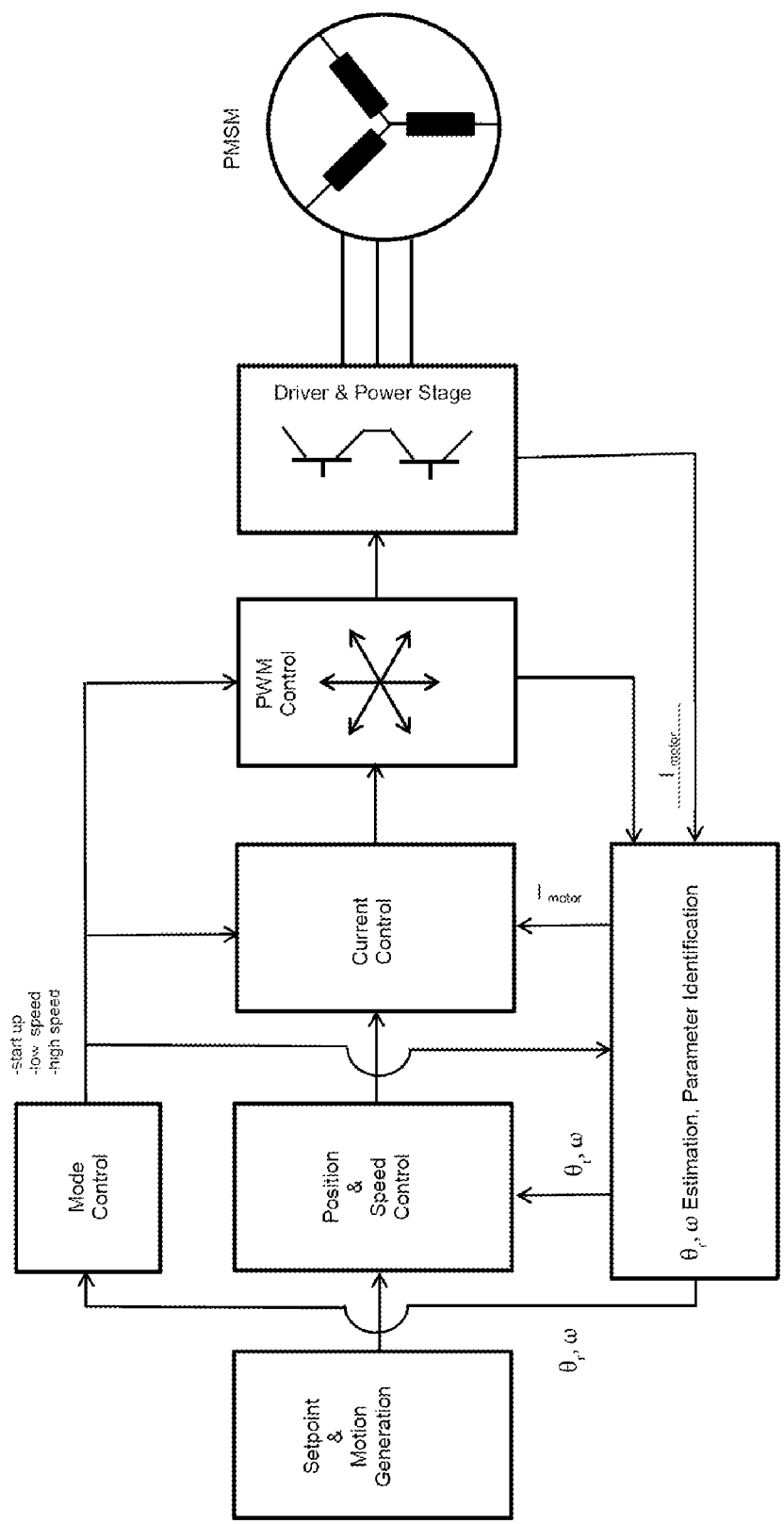
FIG. 8 shows an exemplary schematic diagram illustrating an exemplary control method for determining rotor position according to an embodiments disclosed herein.

FIG. 8 shows a schematic diagram illustrating a control method for an electric motor based on the method for determining the rotor position according to the present invention.

3.2.1 Detection of Rotor Flux Position on Motors

Most sensorless control approaches exploit directly or indirectly the dependence of the stator inductance with the position. According to the present invention, the motor stator current dynamics are directly identified. The dependence of the current dynamics to the rotor position is expoited to estimate the rotor flux position. Dynamic system identification is used as a systematic way of modelling system dynamics from large amounts of measurements. It provides a good immunity to noise. The identified model can moreover be used to synthesize the control system automatically, which reduces the need for configuring the control system for every motor.

There are however a number of constraints to apply identification tools to the problem:

the system applied input needs to be sufficiently rich and persistent such as all the system modes can be identified, the system applied input and states need to be known or measured.

These two constraints pose a number of challenges for which new solutions in the context of electric drives were developed.

An additional aspect that is not critical but worth mentioning is that in general, the direct identification of nonlinear systems such as electric machines is complex and not compatible with real time constraints and control system cost and consumption constraints. It can be observed that most parameters that make the stator current dynamics nonlinear vary sufficiently slowly such that the motor model can be assumed to be a linear parameter varying system. Based on this assumption, we apply linear parametric identification to obtain the system parameters. The control system complexity can thus be kept low.

In the stator reference frame, the dynamics of the stator currents are expressed as follows:

$$\frac{di^s}{dt} = \underbrace{-R^s(L^s)^{-1} i^s}_{\text{effect of stator currents}} + \underbrace{(L^s)^{-1} u^s}_{\text{effect of stator voltages}} + \underbrace{\omega_r(L^s)^{-1} \psi^s}_{\text{effect of flux and speed}} \qquad (5)$$

At standstill the last term is zero. At very low speed it is negligible and the dynamics simplify to:

$$\frac{di^s}{dt} = -R^s(L^s)^{-1} i^s + (L^s)^{-1} u^s \qquad (6)$$

The main issue for using (6) directly to build an observer or identify the system parameters is that the stator voltage $u^S$ is very badly known when a switching occurs. We can only determine the stator voltage $u^S$ quite precisely between time instants where the inverter does not switch. If we measure two currents at two instants and provided that no switching occurred between these two instants, then we know fairly accurately what voltage was applied during that interval and we can fairly well integrate equation (6) using this information. We can therefore get a good estimate of the system parameters if we acquire such pairs of measurements. The issue that prevents doing this practically is that only very small voltages can be applied at standstill and low speed, which implies that very short pulses are applied to the system. A very fast sampling would therefore be required to acquire two successive samples within such pulses.

Observing that at low speed, zero voltage is applied most of the time, one of the key points of the present approach is the identification of the system time constants, $F=R^S(L^S)^{-1}$ in (6) instead of identifying the inductance. This time constant tensor depends on the inductance tensor, which means that it also contains the sought position information. The key advantage of doing this is that unlike the inductance tensor, the time constant tensor can be identified while zero voltage is applied, provided the stator currents are non-zero. The time available to identify the time constant tensor is therefore much longer than the time available to identify the inductance.

When the stator voltage is zero, the dynamics simplify to:

$$\frac{di^s}{dt} = -R^s(L^s)^{-1}i^s \tag{7}$$

To identify the stator current dynamics from (7), non zero currents are required to make a persistent excitation. We therefore apply voltage pulses before start-up to obtain non zero currents. Symmetrical voltage pulse patterns are created such that they do not generate any average torque in order to keep the rotor at standstill. The frequency at which the pulses are alternated is kept sufficiently high such that the alternating torque does not move the rotor. After start-up, we adjust the PWM pattern during operation to obtain a sufficiently persistent excitation as long as required. At low speed the effect of the speed and flux on the dynamics may be non negligible and it therefore needs to be taken into account. The following model therefore needs to be considered during application of zero stator voltages:

$$\frac{di^s}{dt} = -R^s(L^s)^{-1}i^s + \omega_r(L^s)^{-1}\psi^s \tag{8}$$

As long as the speed is very small and the identification procedure fast, the speed and the tensor of inductance can be considered as constant during every estimation cycle. At higher speeds, the voltage induced by the rotor flux angular velocity can not be neglected. In that case, a different method for determining the rotor position may be used.

3.2.2 Variable Switching Frequency PWM and Sampling Strategy

Figure 3A:
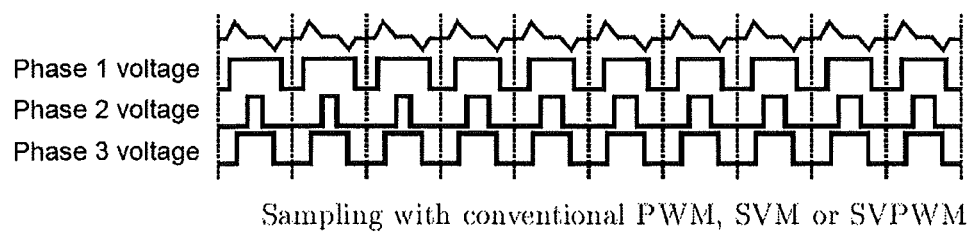
FIG. 3(a) shows an exemplary centered pulse PWM strategy that can be modified as disclosed herein, wherein the switching instants are distributed over an entire switching period.
Figure 3B:
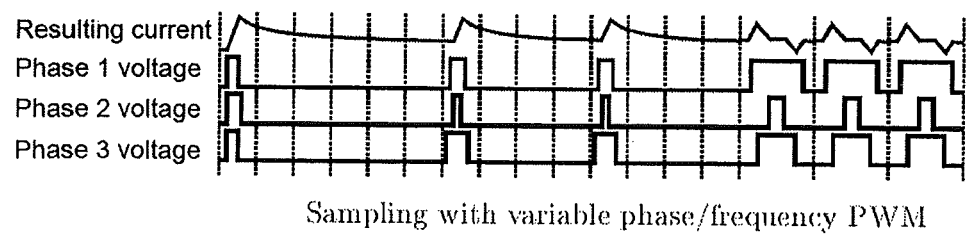
FIG. 3(b) shows an exemplary change to a PWM strategy as disclosed herein, wherein a maximum time between transitions of the inverter is increased to nearly one full switching period, and wherein the switching frequency can be reduced at standstill to increase time between switchings and to reduce a current measurement bandwidth and AD sampling frequency, while accuracy of time constants tensors and resulting rotor position is increased.

Using the standard centered pulse PWM strategy illustrated in FIG. 3(a), the switching instants are distributed over the entire switching period. At standstill and low-speed the transitions are concentrated around 25% and 75% of the switching period. This means that two successive switching instants are separated by at most half a switching period. The series of samples used to identify the matrix of time constants need to be taken during this short time interval as illustrated in FIG. 1(a) and FIG. 3(a). By changing the PWM strategy, the maximum time between transitions of the inverter increase to nearly one full switching period. By reducing the switching frequency at standstill, we further increase the time between switchings. By applying these modifications illustrated by the PWM scheme represented in FIG. 1(b) and FIG. 3(b), the requirements in terms of current measurement bandwidth and AD sampling frequency can be considerably reduced, while the obtained accuracy of the time constants tensors and resulting rotor position is increased.

The proposed approach is compatible with the application of a sufficiently high switching frequency at medium- and high-speeds to obtain an accurate control with low torque and current ripples, fast time response and rejection of disturbances.

3.2.3 Accurate Approach Allowing to Estimate Rotor Position and Magnet Polarity

Based on our experimental investigation, we found that the stator dynamics of some synchronous motors depend on both the rotor and current orientations. This means that the dynamics are not simply functions of the d and q axis (rotor coordinate system) but also on the α and βcomponents (stator coordinate system) of the stator currents. We found that every current angle yields different dynamics. This can be intuitively understood as the dynamics are a function of the rotor and stator fluxes. For every rotor and current angle the autonomous evolution of the currents is therefore given by:

$$i_{k+1}^S = A^S(\theta_r, \theta_i)i_k^S \tag{9a}$$

where the matrix $A^S$ is approximately $$A^S(\theta_r, \theta_i) = \exp{-R^S(L^S)^{-1}T_S} \tag{9b}$$

$\theta_r$ is the rotor angle, $\theta_i$ the stator current (i.e. excitation) angle:

$$i_k^s = |i_k^s|\begin{bmatrix} \cos\theta_i \\ \sin\theta_i \end{bmatrix} \tag{9c}$$

By definition, the component orthogonal to the current vector is zero. It is therefore not possible to identify the associated dynamics. It is only possible to identify the dynamics in the direct current axis. To make the identification of the dynamics associated with the direct axis of the stator current possible, we project the dynamics of the currents in the stator current axis. We assume that the stator dynamics are modelled as:

$$\Delta i_{k+1}^i = \Delta A^i(\theta_r, \theta_i)i_k^i \tag{10}$$

Since at every time instant, the orthogonal component of $i^i_k$ is zero, this can be rewritten as:

$$\Delta i_{k+1}^i = \Delta a^i(\theta_r, \theta_i)i_k^i \tag{11}$$

In this equation $\Delta a^i(\theta_r, \Delta_i)$ is now a vector and $i^i_k$ is a scalar (the magnitude of the current). We can now identify the associated dynamics as we can measure all quantities in equation (11). For a given $\theta_r$, we propose to characterize the variation of $\Delta a^i(\theta_r, \theta_i)$ as a function of $\theta_i$ by a reduced number of harmonic functions:

$$\Delta i_{k+1}^i = \sum_v [a_v^i(\theta_r)\cos(v\theta_i) + b_v^i(\theta_r)\sin(v\theta_i)]i_k^i \tag{12}$$

With this formulation, the parameters only vary with the rotor position. Remarkably, this approach allows to estimate the model parameters with a little bias, which allows to estimate the position very accurately.

3.2.4 Experimental Measurements

Figure 4:
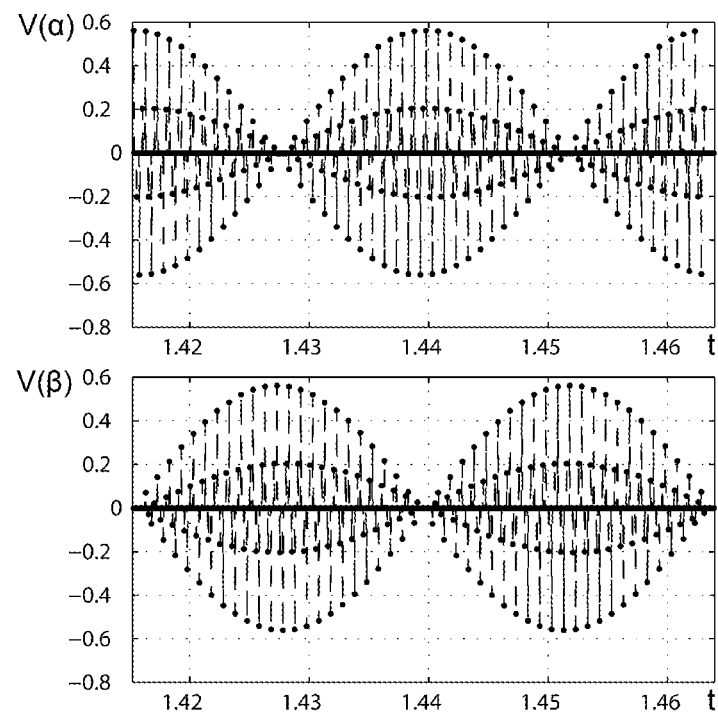
FIG. 4 shows an exemplary applied excitation pattern at start-up, with symmetrical rotating voltage patterns (in α/β stator coordinates) in order to keep the rotor at standstill.
Figure 4:
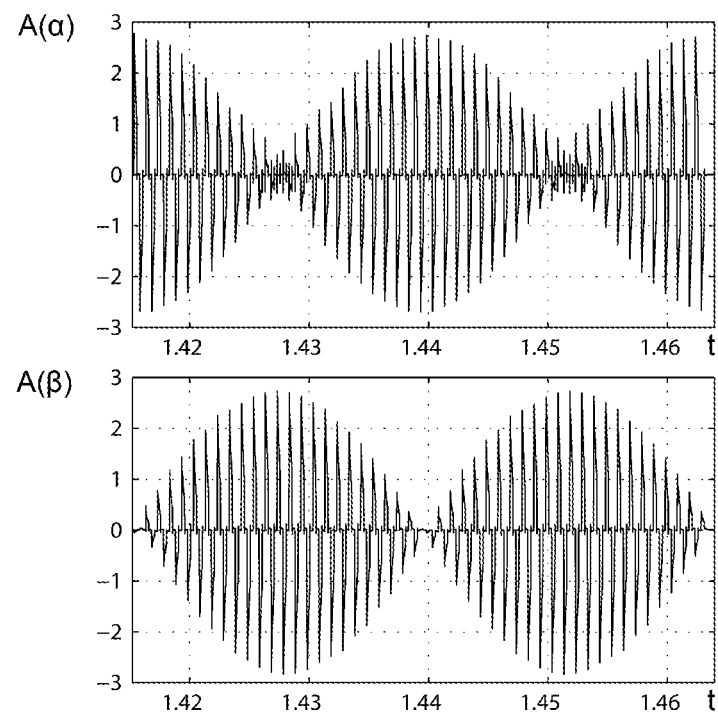

FIG. 4 represents the applied excitation pattern at start-up. We apply symmetrical rotating voltage patterns (in α/β stator coordinates) in order to keep the rotor at standstill. The currents seem to follow exactly the voltage patterns.

Figure 5:
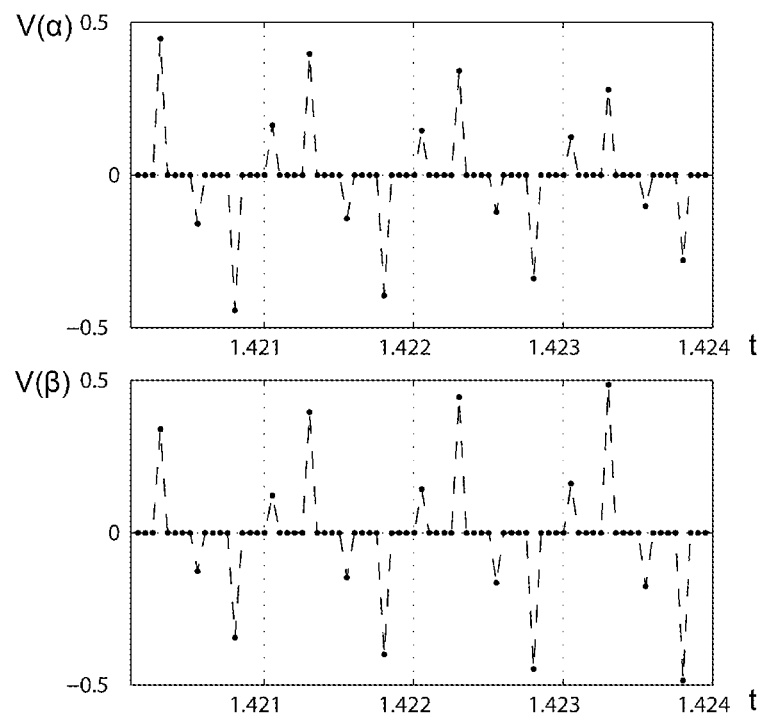
FIG. 5 shows exemplary sampled currents that can be used for identification of a matrix of time constants, with asymmetries between positive and negative currents despite symmetrical voltages.
Figure 5:
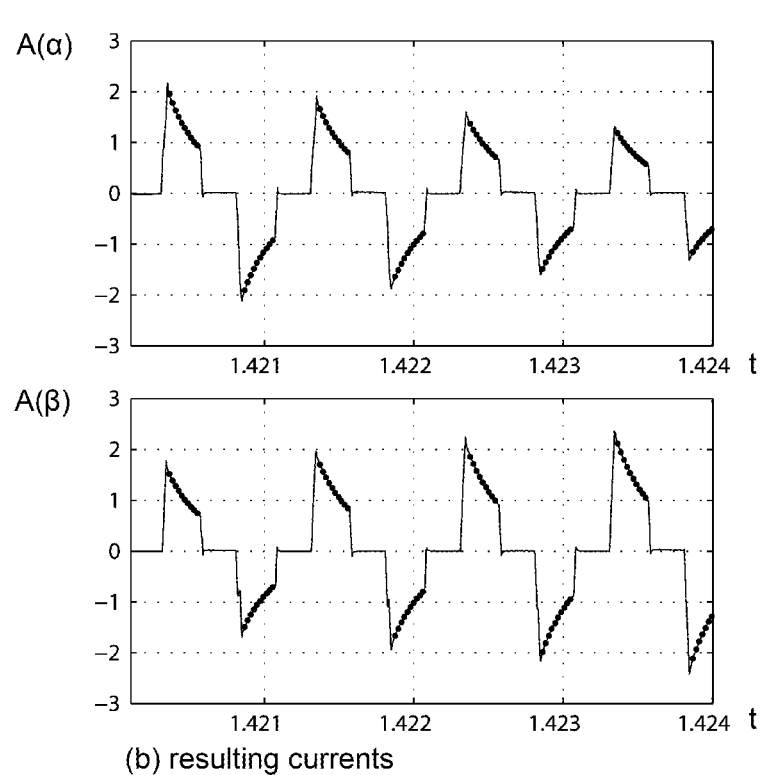

On the zoom in FIG. 5, we can see the sampled currents that are used for the identification of the matrix of time constants. We can see some asymmetries between the positive and the negative currents despite the symmetrical voltages.

Figure 6:
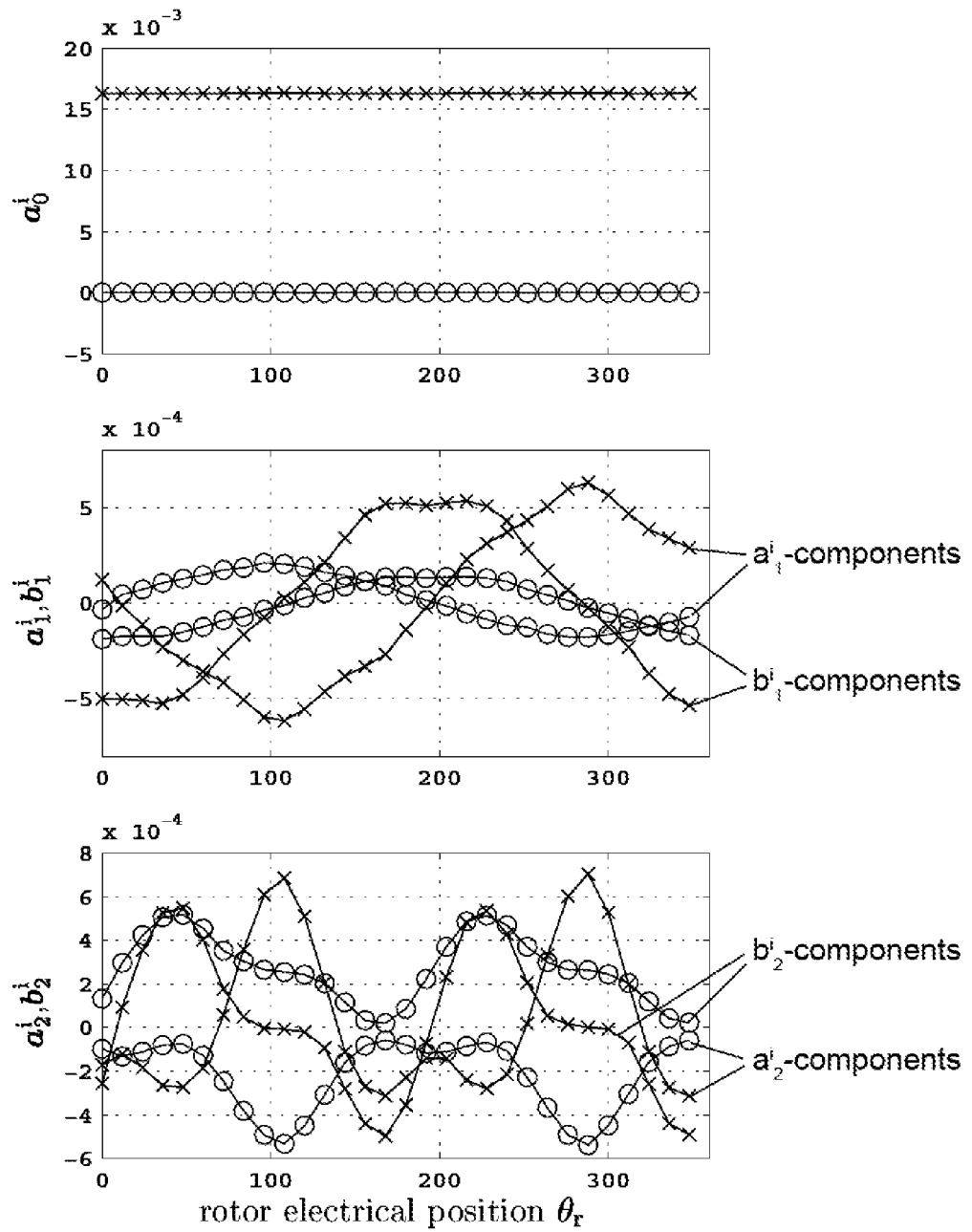
In FIG. 6 shows an exemplary identified harmonic model to obtain a motor characteristic and rotor position.

In FIG. 6, we can see the identified harmonic model that allows to obtain the motor characteristic and the rotor position.

Figure 7:
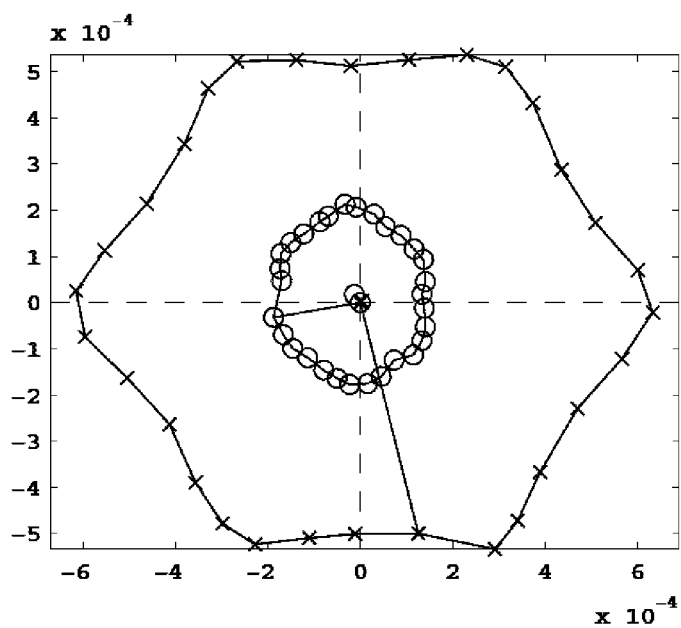
FIG. 7 shows a parameter phase diagram with patterns that can accurately obtain rotor position.
Figure 7:
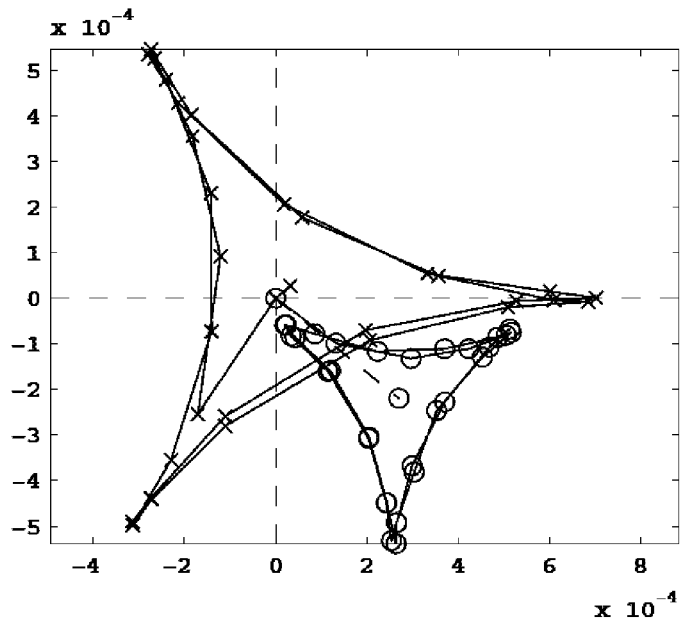

In the parameter phase diagram of FIG. 7, we can see that the patterns allow to obtain accurately the rotor position.

REFERENCES

[1] S. Mariéthoz and M. Morari. Multisampled model predictive control of inverter systems: a solution to obtain high dynamic performance and low distortion. In IEEE ECCE, Energy Conversion Congress and Exhibition, pages 1692-1697, Raleigh, N.C., USA, September 2012.

[2] M. Schroedl and P. Weinmeier. Sensorless control of reluctance machines at arbitrary operating conditions including standstill. Power Electronics, IEEE Transactions on, 9(2): 225-231, 1994.

[3] M. J. Corley and R. D. Lorenz. Rotor position and velocity estimation for a salient-pole permanent magnet synchronous machine at standstill and high speeds. Industry Applications, IEEE Transactions on, 34(4):784-789, 1998.

[4] J. Holtz. Acquisition of position error and magnet polarity for sensorless control of pm synchronous machines. Industry Applications, IEEE Transactions on, 44(4):1172-1180, 2008.

[5] D. K. MacKay. System and method for starting and operating a motor. U.S. Pat. No. 7,592,761 B2, September 2009.

[6] M. Schroedl. Sensorless control of ac machines at low speed and standstill based on the ldquo; inform rdquo; method. In Industry Applications Conference, 1996. Thirty-First IAS Annual Meeting, IAS '96., Conference Record of the 1996 IEEE, volume 1, pages 270-277 vol. 1, 1996.

[7] F. Blaschke, J. van der Burgt, and A. Vandenput. Sensorless direct field orientation at zero flux frequency. In Proc. IEEE Ind. Applicat. Conf., volume 1, pages 189-196, October 1996.

[8] S. Shinnaka. A new speed-varying ellipse voltage injection method for sensorless drive of permanent-magnet synchronous motors with pole saliency—new pll method using highfrequency current component multiplied signal. Industry Applications, IEEE Transactions on, 44(3): 777-788, 2008.

The invention claimed is:

1. A method for determining a position of a rotor of a polyphase motor via a motor control system connected for driving the motor, the method comprising:
   via the motor control system:
      applying, before startup, symmetrical voltage pulse patterns to phases of the motor to keep the rotor stationary;
      measuring a plurality of current samples in each phase between the voltage pulses;
      generating a harmonic model from the measured current samples, the harmonic model defining a motor characteristic and a rotor position;
      determining the rotor position and a rotor polarity from the harmonic model based on the measured current, wherein determination of the rotor position is based solely on current values measured in each phase during a period between the voltage pulses where zero voltage is applied to the phase; and
      controlling a switching frequency of an inverter of the motor based on the rotor position determined from the measured current.

2. The method according to claim 1, wherein determination of the rotor position is based on identification of time constants.

3. The method according to claim 1, wherein determination of the rotor position is based on a model of stator current dynamics expressed by an equation in stator coordinates ($\alpha$, $\beta$) as follows:

$$\frac{di^s}{dt} = -R^s(L^s)^{-1}i^s$$

with
   $i^s$: stator current,
   $R^s$: stator resistance,
   $L^s$: stator inductance.

4. The method according to claim 1, wherein, for each zero-voltage period, a first resulting current vector is determined from a first set of current values, and a second resulting current vector is determined from a second set of current values, wherein a variation between the first and second resulting current vectors is expressed as a variation vector, depending on the rotor position and an excitation angle, times an amount of the first resulting current vector, wherein the variation vector is a function of the excitation angle by a reduced number of harmonic functions, and wherein a rotor angle position is estimated by determining coefficient vectors of the reduced number of harmonic functions.

5. The method according to claim 1, comprising:
   adjusting a pulse width modulation pattern of applied voltage pulses after startup to obtain a substantially persistent excitation of the rotor.

6. The method according to claim 1, wherein voltage is not considered when determining the rotor position.

7. The method according to claim 4, wherein the variation between the first and second resulting current vectors is modelled by a function as follows:

$$\Delta i_{k+1}^i = \Delta a^i(\theta_r, \theta_i) \cdot i_k^i \text{ with}$$

$\Delta i_{k+1}^i$: variation between first and second resulting current vectors projected in a stator current axis,
$\Delta a^i(\theta_r, \theta_i)$: variation vector,
$\theta_r$: rotor angle, corresponding to rotor position in stator coordinates ($\alpha$, $\beta$), and
$\theta_i$: excitation angle in stator coordinates ($\alpha$, $\beta$),
$i_k^i$: amount of the first resulting current vector at time instant k.

8. The method according to claim 7, wherein the variation vector is a reduced number of harmonic functions as follows:

$$\Delta a^i(\theta_r, \theta_i) = \sum_v [a_v^i(\theta_r)\cos(v\theta_i) + b_v^i(\theta_r)\sin(v\theta_i)]$$

with
   $a_v^i(\theta_r)$, $b_v^i(\theta_r)$: coefficient vectors.

9. The method according to claim 1, wherein the applying and measuring steps comprise:
   applying a first voltage pulse to the phases of the motor, wherein the voltage pulse is followed by a first zero-voltage period where zero voltage is applied;
   measuring a first current value from the phases at a first time instant within the first zero-voltage period;
   measuring a second current value from the phases within the first zero-voltage period at a second time instant following the first time instant;
   applying a second voltage pulse to the phases of the motor, wherein the voltage pulse is followed by a second zero-voltage period where zero voltage is applied;
   measuring a first current value from the phases at a first time instant within the second zero-voltage period; and
   measuring a second current value from the phases within the second zero-voltage period at a second time instant following the first time instant.

10. The method according to claim 9, wherein a plurality of voltage pulses is applied to the phases of the motor, each voltage pulse being followed by a zero-voltage period where zero voltage is applied, and wherein a first and second current value is measured within each of the zero-voltage periods at a first time instant and a second time instant respectively.

11. The method according to claim 10, wherein at least a quantity of 6 voltage pulses are applied.

12. The method according to claim 9, wherein a resulting excitation angle of a voltage pulse differs from a resulting excitation angle of a preceding voltage pulse.

13. The method according to claim 12, wherein the resulting excitation angles of the voltage pulses are chosen such that an overall torque applied to the rotor by the plurality of voltage pulses is zero.

14. The method according to claim 9, wherein a first set of current values is measured from the phases at a plurality of time instants within the first zero-voltage period, and a second set of current values is measured from the phases within the first zero-voltage period at a plurality of time instants shifted by a constant time shift.

15. The method according to claim 14, wherein at least a quantity of 24 voltage pulses are applied.

16. The method according to claim 1, wherein the voltage is applied to the phases of the motor by a pulse width modulation inverter, and wherein a pulse width modulation frequency at standstill of the motor is reduced compared to a frequency at high rotating speeds.

17. The method according to claim 16, wherein determination of the rotor position is based on identification of time constants.

18. The method according to claim 16, wherein the pulse width modulation frequency is reduced by at least 80%.

19. The method according to claim 16, wherein the pulse width modulation frequency is reduced by at least 50%.

20. The method according to claim 19, wherein the pulse width modulation frequency is reduced such that a sampling frequency used for measuring the current in the motor phases is at least 20 times higher than the pulse width modulation frequency.

21. The method according to claim 19, wherein the pulse width modulation frequency is reduced such that a sampling frequency used for measuring the current in the motor phases is at least 10 times higher than the pulse width modulation frequency.

* * * * *